(12) United States Patent
Ozalevli et al.

(10) Patent No.: US 10,859,603 B1
(45) Date of Patent: Dec. 8, 2020

(54) DYNAMICALLY CONTROLLED AUTO-RANGING CURRENT SENSE CIRCUIT

(71) Applicant: Apple Inc., Cupertino, CA (US)

(72) Inventors: Erhan Ozalevli, Santa Clara, CA (US); Evaldo M. Miranda, Jr., Saratoga, CA (US); Behzad Mohtashemi, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/734,017

(22) Filed: Jan. 3, 2020

(51) Int. Cl.
　　　H03K 17/082　　(2006.01)
　　　G01R 15/14　　(2006.01)
　　　H03F 3/45　　(2006.01)

(52) U.S. Cl.
　　　CPC ....... G01R 15/146 (2013.01); H03F 3/45376 (2013.01); H03K 17/0822 (2013.01); *H03F 2200/27* (2013.01); *H03F 2200/462* (2013.01); *H03F 2200/519* (2013.01); *H03F 2200/522* (2013.01); *H03F 2200/555* (2013.01); *H03F 2200/78* (2013.01)

(58) Field of Classification Search
　　　CPC .... G01R 15/14; G01R 15/146; G01R 15/148; H03F 3/45376; H03F 3/45381; H03F 3/45385; H03F 3/4539; H03F 2200/27; H03F 2200/78; H03F 2200/462; H03F 2200/519; H03F 2200/522; H03F 2200/555; H03K 17/08; H03K 17/082; H03K 17/0822; H03K 17/0824; H03K 17/0826; H03K 17/0828

USPC .................................................. 327/108–112
See application file for complete search history.

(56) References Cited

U.S. PATENT DOCUMENTS

| | | | |
|---|---|---|---|
| 5,977,899 A * | 11/1999 | Adams | H03M 3/50 341/143 |
| 8,198,874 B2 | 6/2012 | Melanson | |
| 8,447,275 B2 | 5/2013 | Dearborn | |
| 9,716,385 B2 * | 7/2017 | Dickey | H03K 17/122 |
| 9,748,852 B2 | 8/2017 | Freeman et al. | |
| 9,835,660 B2 | 12/2017 | Soma et al. | |
| 2012/0069638 A1 * | 3/2012 | Matsuda | G11C 11/1673 365/158 |
| 2014/0152285 A1 * | 6/2014 | Rozek | H02M 3/156 323/285 |
| 2014/0176120 A1 * | 6/2014 | Aerts | G01R 1/203 324/123 R |
| 2019/0128932 A1 * | 5/2019 | Fernandez | H03F 3/45071 |

* cited by examiner

*Primary Examiner* — Diana J. Cheng
(74) *Attorney, Agent, or Firm* — Fenwick & West LLP

(57) ABSTRACT

Embodiments relate to sensing a current provided by a power supply circuit. The current sensing circuit includes a sense transistor for sensing the current provided by a main transistor, a driver for controlling a bias provided to the sense transistor and the main transistor, and a sense resistor for converting the sensed current to a voltage value. Moreover, the current sensing circuit includes a controller that modifies at least one of: (a) a resistance of the main transistor by adjusting the bias voltage provided by the driver, (b) a gain ratio between a load current and a sensing current by adjusting a number of individual devices that are active in the sense transistor, and (c) a resistance of the sense resistor.

20 Claims, 13 Drawing Sheets

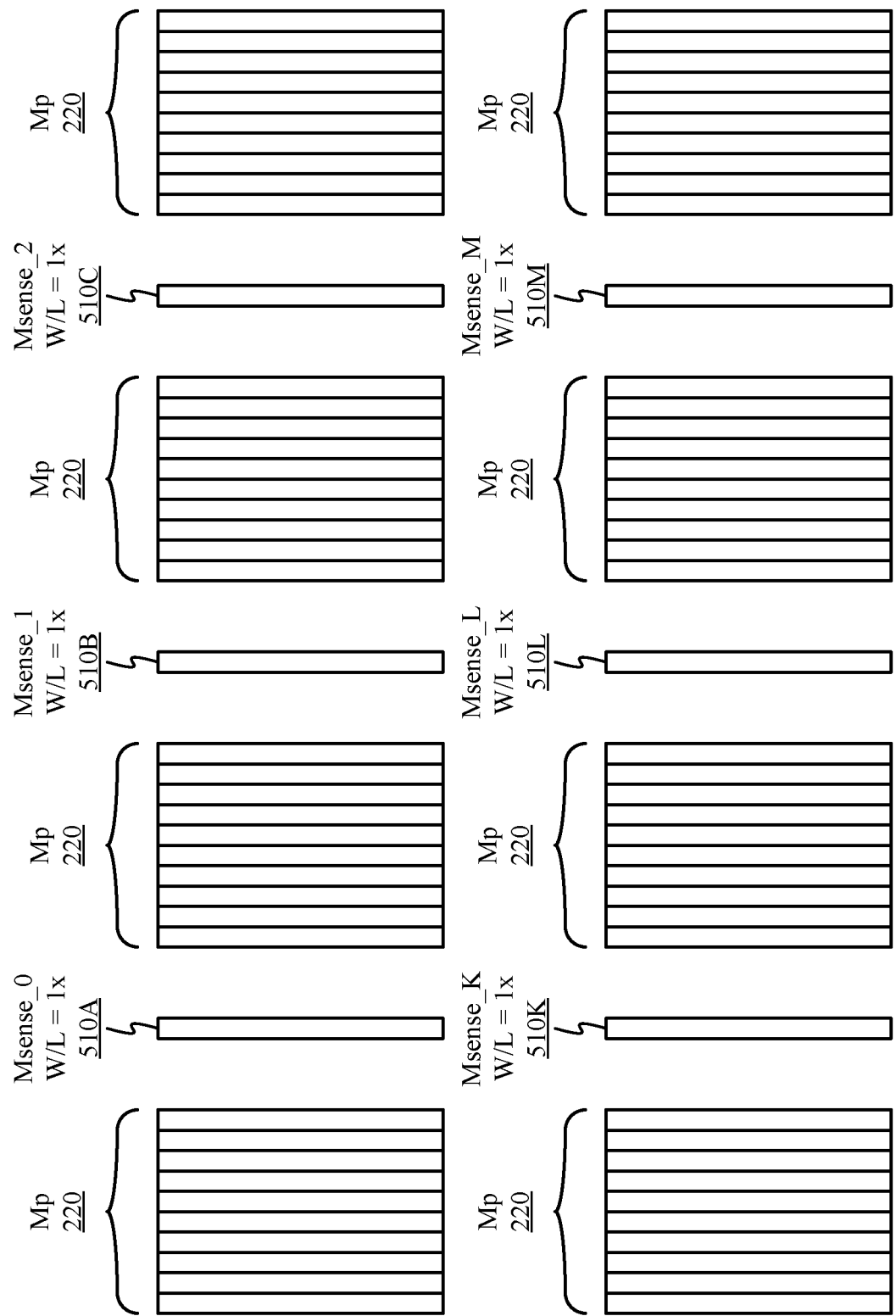

DYNAMICALLY CONTROLLED AUTO-RANGING CURRENT SENSE CIRCUIT

BACKGROUND

1. Field of the Disclosure

The present disclosure relates a circuit for a current sense circuit and more specifically to a dynamic auto-ranging current sensing circuit.

2. Description of the Related Arts

Current sensing is used in a wide variety of application including battery life indicators, battery charger control, over current protection, circuits supervision, current and voltage regulation, ground fault detection, proportional solenoid control, etc. Current sense circuits suffer from many sources of error including mismatch between the power and sense transistors, offset and gain limit in amplifiers, process variation of sense resistors, and input referred noise at large sense ratios. For example, for high load currents, threshold voltages (VT), channel width/length ratios (W/L), and metallization mismatches between power and sense transistors become a significant source of error for current sense circuits. Moreover, for low load currents, amplifier offset and the limit in the gain of the amplifier can cause a significant error in the sensing of the load current.

SUMMARY

Embodiments relate to sensing a current provided by a power supply circuit. The current sensing circuit includes a sense transistor for sensing the current provided by a main transistor, a driver for controlling a bias provided to the sense transistor and the main transistor, and a sense resistor for converting the sensed current to a voltage value. The current sensing circuit includes a controller that modifies at least one of (a) a resistance of the main transistor by adjusting the bias voltage provided by the driver, (b) a gain ratio between a load current and a sensing current by adjusting a number of individual devices that are active in the sense transistor, and (c) a resistance of the sense resistor.

BRIEF DESCRIPTION OF THE DRAWINGS

Figure (FIG. 1 is a high-level diagram of an electronic device, according to one embodiment.

FIG. 5E is a plan view illustrating a layout of the sense transistors and the main transistor, according to one embodiment.

The figures depict, and the detail description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments relate to a dynamically controlled auto-ranging current sensing circuit that dynamically adjusts the sensitivity based on the current level being provided to a load. The dynamically controlled auto-ranging current sensing circuit modifies a bias voltage provided by a driver to a main transistor and a sense transistor, a current gain between a load current and a sensing current, and a resistance of a sensing resistor that generates a voltage proportional to the current generated by the sense transistor. Moreover, the dynamically controlled auto-ranging current sensing circuit includes a low-resolution analog-to-digital converter (ADC) for converting the voltage generated by the sense transistor to a digital value. The digital value provided by the low-resolution ADC is adjusted based on the current gain, and the resistance of the sensing resistor to match the performance of a high-resolution ADC.

Exemplary Electronic Device

Embodiments of electronic devices, user interfaces for such devices, and associated processes for using such devices are described. In some embodiments, the device is a portable communications device, such as a mobile telephone, that also contains other functions, such as personal digital assistant (PDA) and/or music player functions. Exemplary embodiments of portable multifunction devices include, without limitation, the iPhone®, iPod Touch®, Apple Watch®, and iPad® devices from Apple Inc. of Cupertino, Calif. Other portable electronic devices, such as wearables, laptops or tablet computers, are optionally used. In some embodiments, the device is not a portable communications device, but is a desktop computer or other computing device that is not designed for portable use. In some embodiments, the disclosed electronic device may include a touch sensitive surface (e.g., a touch screen display and/or a touch pad). An example electronic device described below in conjunction with FIG. 1 (e.g., device 100) may include a touch-sensitive surface for receiving user input. The electronic device may also include one or more other physical user-interface devices, such as a physical keyboard, a mouse and/or a joystick.

Figure 1:
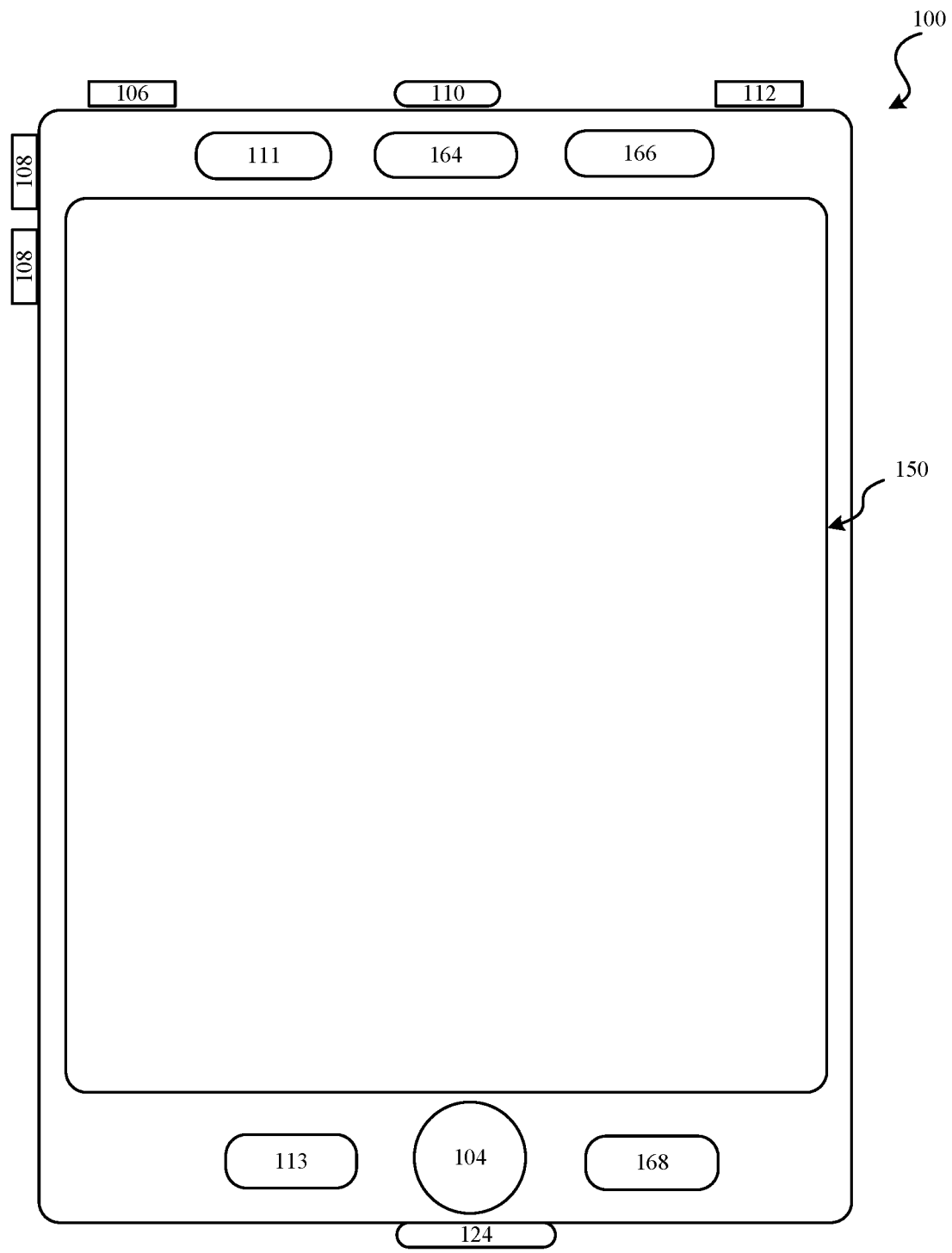

Figure (FIG. 1 is a high-level diagram of an electronic device 100, according to one embodiment. Device 100 may include one or more physical buttons, such as a "home" or menu button 104. Menu button 104 is, for example, used to navigate to any application in a set of applications that are executed on device 100. In some embodiments, menu button 104 includes a fingerprint sensor that identifies a fingerprint on menu button 104. The fingerprint sensor may be used to determine whether a finger on menu button 104 has a fingerprint that matches a fingerprint stored for unlocking device 100. Alternatively, in some embodiments, menu button 104 is implemented as a soft key in a graphical user interface (GUI) displayed on a touch screen.

In some embodiments, device 100 includes touch screen 150, menu button 104, push button 106 for powering the device on/off and locking the device, volume adjustment buttons 108, Subscriber Identity Module (SIM) card slot 110, head set jack 112, and docking/charging external port 124. Push button 106 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also accepts verbal input for activation or deactivation of some functions through microphone 113. The device 100 includes various components including, but not limited to, a memory (which may include one or more computer readable storage mediums), a memory controller, one or more central processing units (CPUs), a peripherals interface, an RF circuitry, an audio circuitry, speaker 111, microphone 113, input/output (I/O) subsystem, and other input or control devices. Device 100 may include one or more image sensors 164, one or more proximity sensors 166, and one or more accelerometers 168. The device 100 may include components not shown in FIG. 1.

Device 100 is only one example of an electronic device, and device 100 may have more or fewer components than listed above, some of which may be combined into a component or have a different configuration or arrangement. The various components of device 100 listed above are embodied in hardware, software, firmware or a combination thereof, including one or more signal processing and/or application specific integrated circuits (ASICs). Device 100 may include one or more current sense circuits described herein.

Example Current Sense Circuit

Figure 2:
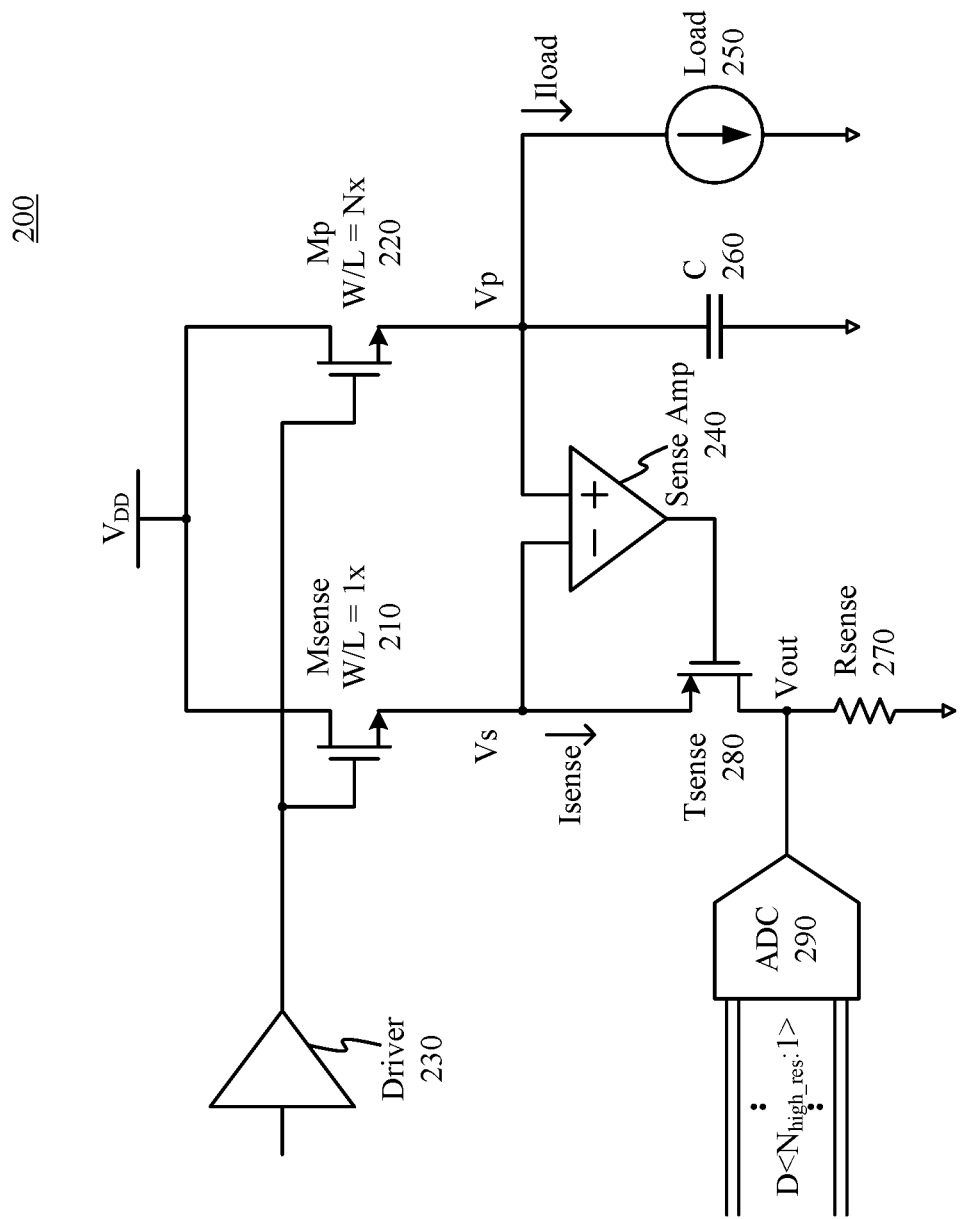
FIG. 2 is a circuit diagram illustrating a current sense circuit, according to one embodiment.

FIG. 2 is a circuit diagram illustrating current sense circuit 200, according to one embodiment. The current sense circuit 200 includes main transistor Mp 220 for driving a load current Iload to a load 250, and a sense transistor Msense 210 for providing a sense current Isense that has an amplitude based on the load current Iload to a sense resistor Rsense 270. The sense current Isense may be proportional to the load current Iload. The relationship between the sense current Isense and the load current Iload may be based on a size ratio between the sense transistor Msense 210 and the main transistor Mp 220. The output of the main transistor Mp 220 may be coupled to a capacitor C 260.

The current sense circuit 200 further includes a driver 230 that provides a driving voltage to the main transistor Mp 220 and the sense transistor Msense 210. The driver 230 is coupled to the gate of the main transistor Mp 220 and the gate of the sense transistor Msense 210. In some embodiments, the driver 230 provides a bias voltage to the gate of the main transistor Mp 220 and the gate of the sense transistor Msense 210. In yet other embodiments, the driver 230 is a low resolution digital to analog converter (DAC) that receives a digital control signal and generates the analog voltage provided to the gate of the main transistor Mp 220 and the gate of the sense transistor Msense 210.

The current sense circuit 200 additionally includes an amplifier transistor Tamp 280 that is controlled by a sense amplifier 240. The amplifier transistor Tamp 280 is coupled between the sense transistor Msense 210 and the sense resistor Rsense 270. The sense amplifier 240 includes a first input terminal that is coupled to an output of the main transistor Mp 220, and a second input terminal that is coupled to an output of the sense transistor Msense 210. The output of the sense amplifier 240 is then coupled to a gate of the amplifier transistor Tamp 280. The sense amplifier forces the voltage at the output of the sense transistor Msense 210 to be the voltage at the output of the main transistor Mp 220. Because the gate of the main transistor Mp 220 and the gate of the sense transistor Msense 210 are connected together, the sense amplifier 240 forces the gate-to-source voltage (Vgs) of the sense amplifier Msense 210 to be the Vgs of the main transistor Mp 220.

The current sense circuit 200 further includes a digital-to-analog converter (ADC) 290 coupled to the sense resistor Rsense 270. The ADC 290 senses the voltage at one terminal of the sense resistor Rsense 270 and converts the sensed voltage to a digital value $D<N_{high\_res}:1>$. Since the value of the sense resistor Rsense 270 is known, the amplitude of the sense current Isense can be determined by dividing the voltage Vout by the resistance Rsense 270. Moreover, since the size ratio between the size of the main transistor Mp 220 and the size of the sense transistor Msense 210 is known, the load current Iload can be determined by multiplying the sense current Isense by this ratio. In the current sense circuit 200 of FIG. 2, the ADC has a high resolution to enable an accurate reading of the voltage Vout and thus, an accurate sensing of the load current Iload.

However, in the current sense circuit 200, errors may be introduced during the sensing process. For instance, the voltage (Vp) at the load side is equal to:

$$Vp = V_{DD} - \Delta Vp, \text{ where } \Delta Vp = I_{load}(Ron_p + Rm_p) \quad (1)$$

and the voltage (Vs) at the sense side is equal to:

$$Vs = V_{DD} - \Delta Vs, \text{ where } \Delta Vs = I_{sense}(Ron_s + Rm_s) \quad (2)$$

where $Ron_p$ and $Ron_s$ are the on resistances of the main transistor Mp 220 and the sense transistor Msense 210, and $Rm_p$ and $Rm_s$ are metallization resistances of the main transistor Mp 220 and the sense transistor Msense 210.

Moreover, the relationship between Vs and Vp can be expressed using the following equation:

$$A_V(Vp - Vs + V_{off}) = Vs \quad (3)$$

where $A_v$ is the gain of the sense amplifier 240 and $V_{off}$ is the offset of the sense amplifier 240. Thus, substituting Vs and Vp, we obtain:

$$A_v(V_{DD} - \Delta Vp + V_{off}) = (A_v + 1)(V_{DD} - \Delta Vs) \quad (4)$$

$$\Delta V_s = \Delta V_p \frac{A_v}{A_v+1} - V_{\text{off}} \cdot \frac{A_v}{A_v+1} + V_{DD} \cdot \frac{1}{A_v+1} \quad (5)$$

Therefore:

$$I_{\text{sense}} = I_{\text{load}} \cdot \frac{Ron_p + Rm_p}{Ron_s + Rm_s} \cdot \frac{A_v}{A_v+1} + \frac{-V_{\text{off}} + V_{dd}/A_v}{Ron_s + Rm_s} \cdot \frac{A_v}{A_v+1} \quad (6)$$

and $$V_{out} = \quad (7)$$
$$I_{\text{load}} \cdot \frac{Ron_p + Rm_p}{Ron_s + Rm_s} \cdot \frac{A_v}{A_v+1} \cdot R_{\text{sense}} + \frac{-V_{\text{off}} + V_{dd}/A_v}{Ron_s + Rm_s} \cdot \frac{A_v}{A_v+1} \cdot R_{\text{sense}}$$

As a result, both the sense current (Isense) and the sense voltage (Vout) are prone to errors due to a limited amount of gain of the sense amplifier 240 and an offset in the sense amplifier 240.

Example Dynamic Auto-Ranging Current Sense Circuit

Figure 3:
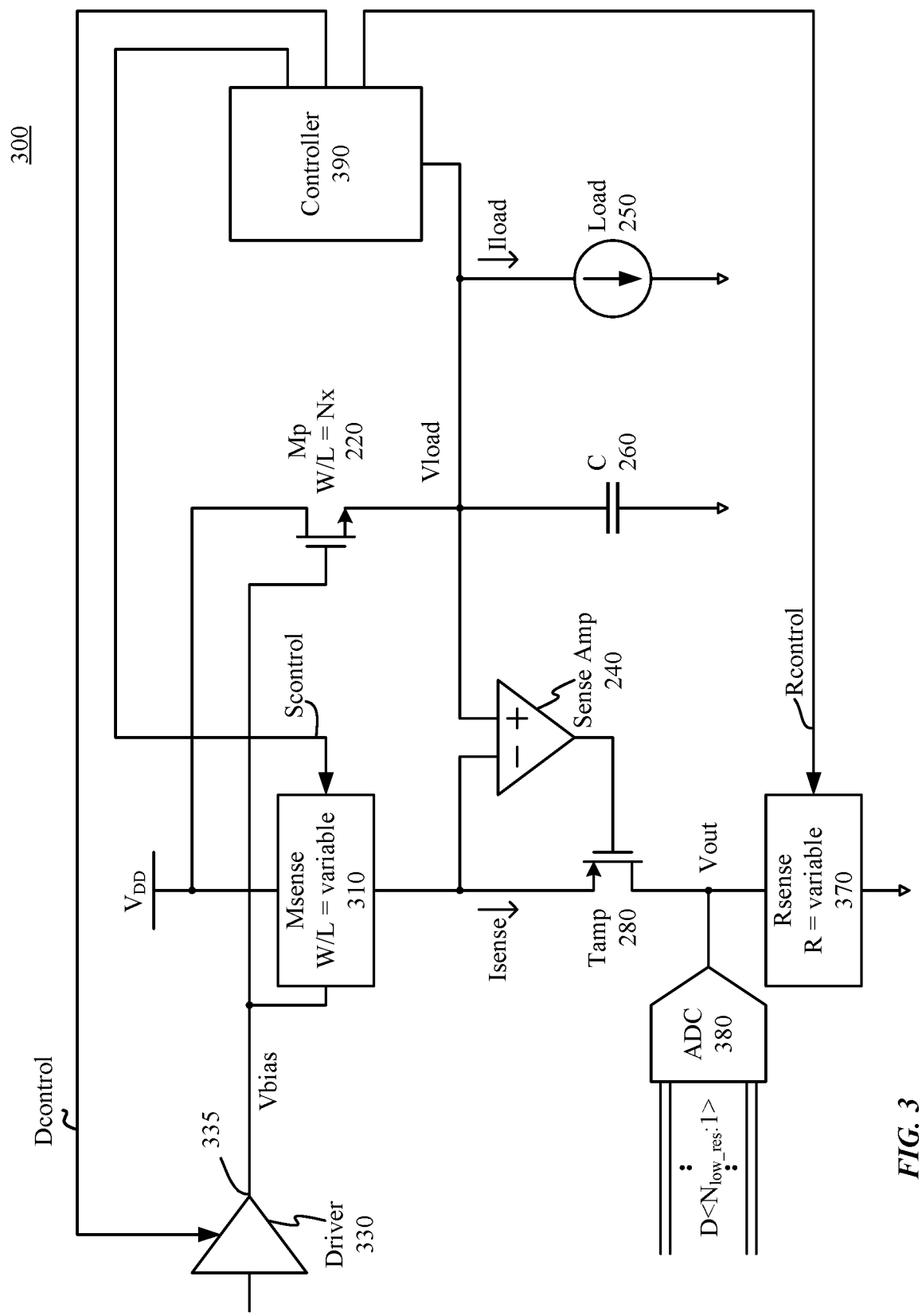
FIG. 3 is a circuit diagram, illustrating a dynamic auto-ranging current sense circuit, according to one embodiment.

FIG. 3 is a circuit diagram, illustrating dynamic auto-ranging current sense circuit 300, according to one embodiment. The dynamic auto-ranging current sense circuit 300 may include, among other components, main transistor Mp 220 for driving a load current Iload to a load 250, and a sense transistor Msense 310 for providing a sense current Isense that has an amplitude based on the load current Iload to a sense resistor Rsense 370. The dynamic auto-ranging current sense circuit 300 further includes a driver 330 that provides a driving voltage to the main transistor Mp 220 and the sense transistor Msense 310. The driver 330 is coupled to the gate of the main transistor Mp 220 and the gate of the sense transistor Msense 310. Additionally, the dynamic auto-ranging current sense circuit 300 includes a low resolution ADC 380 that converts the analog voltage at the sense resistor Rsense 370 to a digital value D<$N_{low\_res}$:1>.

Controller 390 is a circuit that controls the driver 330, sense transistor Msense 310, and the sense resistor Rsense 370. The controller 390 receives as an input the voltage at an output of the main transistor Mp 220 and generates control signals for the driver 330, the sense transistor Msense 310, and the sense resistor Rsense 370. In particular, the controller 390 generates a control signal Dcontrol to control the driver 330, a control signal Scontrol to control the sense transistor Msense 310, and a control signal Rcontrol to control the sense resistor Rsense 370. The controller 390 is described in more detail below in conjunction with FIG. 7.

The driver 330 provides a bias voltage Vbias to the main transistor Mp 220 and the sense transistor Msense 310. The driver 330 receives as an input control signal Dcontrol. Moreover, the output 335 of the driver 330 is coupled to the sense transistor Msense 310 and the main transistor Mp 220. By changing the bias voltage Vbias, the on resistance (Rdson) of the main transistor Mp 220 and the on resistance (Rdson) of the sense transistor Msense 310 is controlled. Adjusting Rdson of the main transistor Mp 220 and the sense transistor Msense 310 does not change the value of sense voltage Vout but improves sense accuracy. Increasing Rdson allows for bigger voltage drop at lower load currents and keeps the signal level high relative to offset and noise. That is, adjusting Rdson adjusts the sense voltage signal amplitude across the main transistor Mp 220 and the sense transistor Msense 310. At larger voltage drops across the main transistor Mp 220 and the sense transistor Msense 310, sensing is less susceptible to offset and noise.

In some embodiments, as the drain-to-source voltage (Vds) of the main transistor Mp 220 decreases, Rdson of the main transistor Mp 220 and Rdson of the sense transistor Msense 310 are increased. For instance, if the Vds of the main transistor Mp 220 decreases below a first threshold Vds value (VTH_LOW) (e.g., VDS_LOW=30 mV), Rdson is increased to keep Vds higher than VTH_LOW. Rdson of the main transistor Mp 220 may be increased by lowering the gate-to-source voltage (Vgs) of the main transistor Mp 220.

In some embodiments, as Vds of the main transistor Mp 220 increases, Rdson of the main transistor Mp 220 and the sense transistor Msense 310 are decreased. For instance, if the Vds of the main transistor Mp 220 increases above a second threshold Vds value (VTH_HIGH) (e.g., VTH_HIGH=60 mV), Rdson is decreased to keep Vds lower than VTH_HIGH. Rdson of the main transistor Mp 220 may be decreased by increasing the Vgs of the main transistor Mp 220.

In some embodiments, Vgs of the main transistor Mp 220 and the sense transistor Msense 310 provided by the driver 330 is increased or decreased in discrete steps. The driver 330 is described below in more detail in conjunction with FIG. 4.

The size of the sense transistor Msense 310 is controlled by controller 390. In some embodiments, the size of the sense transistor Msense 310 is expressed as a ratio (W/L) between the channel width (W) and the channel length (L) of the sense transistor Msense 310. The size of the sense transistor Msense 310 may be controlled by activating or deactivating individual sense devices that are connected in parallel. In some embodiments, each of the sense devices of the sense transistor Msense 310 have the same length. As such, an effective width of the sense transistor Msense 310 can be increased or decreased by activating or deactivating a subset of devices. By increasing or decreasing the size of the sense transistor Msense 310, the ratio between the sense current Isense and the load current Iload (sense current ratio) can be increased or decreased.

In some embodiments, as the load current Iload decreases, the sense current ratio is decreased to maintain the output voltage Vout within a set range. For instance, if the load current Iload reaches a first threshold value, the sense current ratio is decreased. In some embodiments, Vds of the main transistor Mp 220 is used as a proxy to determine whether the load current Iload has reached the first threshold value. For instance, if Vds of the main transistor Mp 220 decreases below VTH_LOW, the sense ratio is decreased. Changing the sense current ratio is advantageous, among other reasons, because the dynamic range and noise performance of the dynamic auto-ranging current sense circuit 300 can be enhanced. Lower sense current ratio helps to decrease input referred noise at low current conditions. However, if the sense current ratio is lowered at high current conditions, power consumption is increased due to increased sense current.

In some embodiments, as the load current Iload increases, the sense current ratio is increased to maintain the output voltage Vout within the set range. For instance, if the load current Iload reaches a second threshold value, the sense current ratio is increased; and if Vds of the main transistor Mp 220 increases above VTH_HIGH, the sense current ratio is increased. The sense current ratio may be increased or decreased in discrete steps. The variable size sense transistor Msense 310 is described below in more detail in conjunction with FIG. 5.

The resistance (R) of the sense resistor Rsense 370 is controlled by the controller 390. The sense resistor Rsense may include a resistor ladder with multiple resistors in series. The resistance of the sense resistor Rsense 370 may be controlled by selecting a node in the resistance ladder and connecting the selected node to ground. By increasing or decreasing the resistance R of the sense resistor Rsense 370, the value of the sense voltage Vout can be increased or decreased accordingly.

In some embodiments, as the load current Iload decreases, the resistance R of the sense resistor Rsense 370 is increased to maintain the output voltage Vout within a set range. For instance, if the load current reaches a first threshold value, the resistance of the sense resistor Rsense 370 is increased. In some embodiments, Vds of the main transistor Mp 220 is used as a proxy to determine whether the load current Iload has reached the first threshold value. For instance, if Vds of the main transistor Mp 220 decreases below VTH_LOW, the resistance R of the sense resistor Rsense 370 is increased. Changing the resistance R of the sense resistor Rsense 370 is advantageous, among other reasons, because as the load current Iload changes, and thus the sense current Isense changes, the output voltage Vout is kept within the dynamic range of the ADC 380, allowing the use of a low resolution ADC.

In some embodiments, as the load current Iload increases, the resistance R of the sense resistor Rsense 370 is decreased to maintain the output voltage Vout within the set range. For instance, if the load current reaches a second threshold value, the resistance of the sense resistor Rsense 370 is decreased. For example, if Vds of the main transistor Mp 220 increases above VTH_HIGH, the resistance R of the sense resistor Rsense 370 is decreased. The resistance R of the sense resistor Rsense 370 may be increased or decreased in discrete steps. The variable sense resistor Rsense 370 is described below in more detailed in conjunction with FIG. 6.

In some embodiments, adjusting Rdson of the main transistor Mp 220, adjusting the resistance R of the sense resistor Rsense 370, and adjusting the sense current ratio are performed independently. The adjustment of each of Rdson, resistance R and the sense current ratio can be associated with different current thresholds.

The analog-to-digital converter (ADC) 380 is coupled to the sense resistor Rsense 370 and converts the voltage Vout at the sense resistor Rsense 370 to a digital value D<$N_{low\_res}$:1>. In some embodiments, the ADC 380 has a low resolution. For instance, the resolution of ADC 380 is lower than the resolution of ADC 290 of the current sense circuit 200 of FIG. 2. Using a low resolution ADC reduces the area occupied by the ADC.

Figure 4:
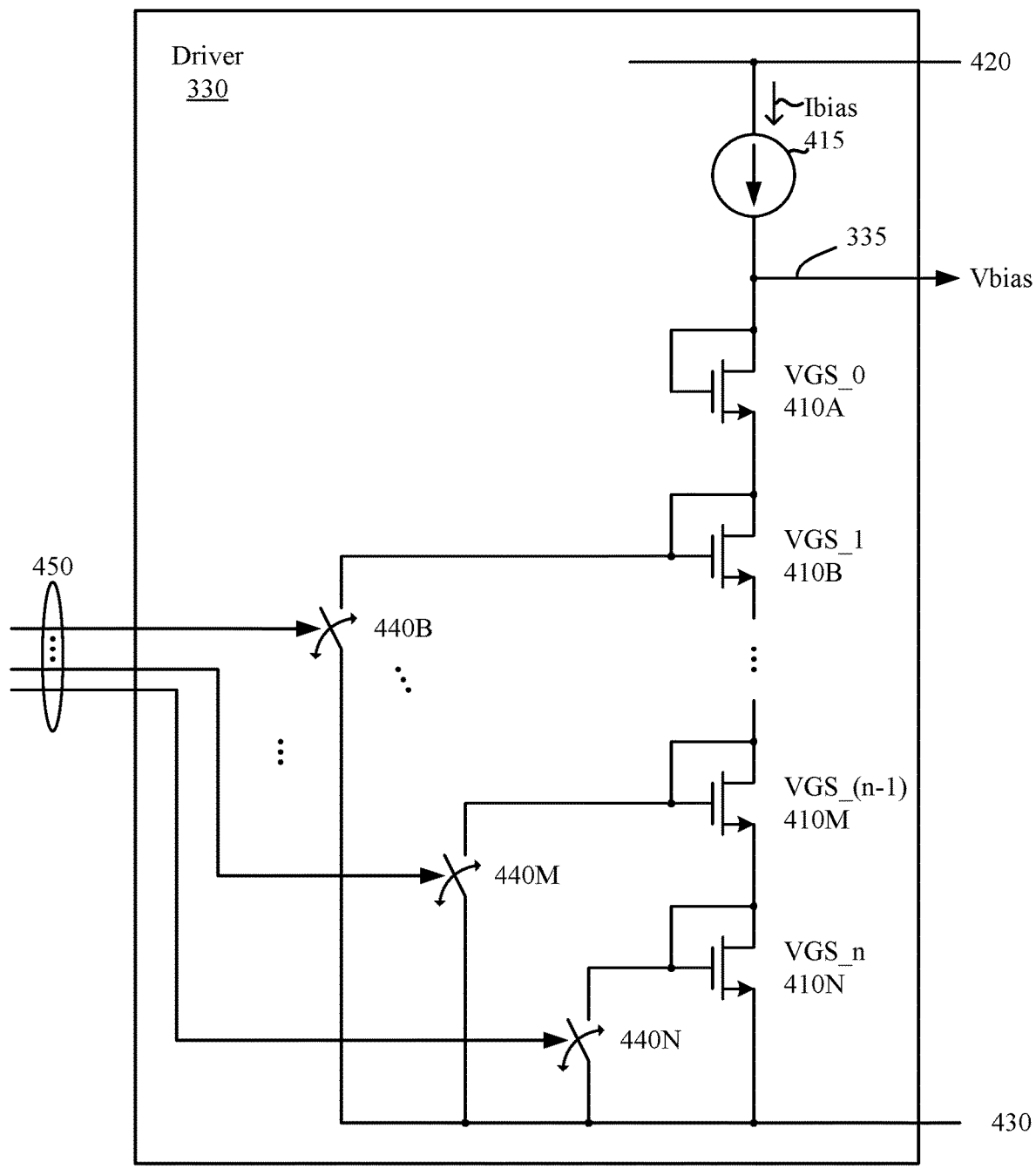
FIG. 4 is a circuit diagram illustrating the driver of the dynamic auto-ranging current sense circuit of FIG. 3, according to one embodiment.

FIG. 4 is a circuit diagram illustrating the driver 330 of the dynamic auto-ranging current sense circuit 300 of FIG. 3, according to one embodiment. The driver 330 may include, among other components, a chain of diode connected transistors 410A through 410N connected in series and a current source Ibias 415. The current source Ibias 415 and the chain of diode connected transistors 410A through 410N are connected between a first terminal 420 and a second terminal 430. In some embodiments, the first terminal 420 is a power supply terminal (Vdd). Moreover, the second terminal 430 may be connected to an output terminal of the main transistor Mp 220 of FIG. 3. The gate of each of a subset of diode connected transistors 410A through 410N is connected to the second terminal 430 through one of switches 4 440B through 440N. In the example of FIG. 4, the gate of the second diode connected transistor 410B is connected to the second terminal 430 through switch 440B, the gate of the (n−1)th diode connected transistor 410M is connected to the second terminal 430 through switch 440M, and the gate of the nth diode connected transistor 410N is connected to the second terminal 430 through switch 440N.

Each of the switches 440B through 440N is controlled by a driver control signal 450. In some embodiments the driver control signal 450 is the control signal Dcontrol received from the controller 390. In one embodiment, the driver control signal 450 is generated using an address decoder (not shown) based on a binary signal Dcontrol received from the controller 390.

When one of the switches 440B through 440N is closed, a source terminal of a previous diode connected transistor 410 is connected to the second terminal, bypassing a subset of diode connected transistors 410. For instance, if a jth switch is closed, the source of the (j−1)th diode connected transistor is connected to the second terminal 430, bypassing the jth to nth diode connected transistors. As such, the bias current Ibias is configured to flow through the first to the (j−1)th diode connected transistors. As a result, the output voltage (Vbias) of the driver 330 is equal to the sum of the gate-to-source voltage (Vgs) of the first to the (j−1)th diode connected transistors as shown in the following equation:

$$Vbias = \sum_{k=0}^{(j-1)} VGS\_k \tag{8}$$

As such, the bias voltage Vbias provided by the driver 330 to the main transistor Mp 220 and the sense transistor Msense 310 is controlled by controlling the number of diode connected transistors 410 the bias current Ibias flows through. That is, for a given transistor, $$Ibias = \frac{1}{2}\mu Cox \frac{W}{L}(Vgs - Vth)^2$$

Thus, the following equation can also be derived:

$$Vgs = \sqrt{\frac{2 Ibias}{\mu Cox\left(\frac{W}{L}\right)}} + Vth \tag{9}$$

If every diode connected transistor 410 is identical (i.e., if the channel length and width for each of the diode connected transistors 410 are equal), the value of the bias voltage Vbias would be proportional to the number of diode connected transistors that are connected in series without being bypassed by a switch 440. As such, the gate voltage of the main transistor 220 can be changed in discrete steps equal to the gate-to-source voltage (Vgs) of a single diode connected transistor 410. In some embodiments, the size of each the diode connected transistors 410 are selected based on a desired step. That is, if a non-uniform step is desired, diode connected transistors 410 with differing sizes may be used.

Figure 5A:
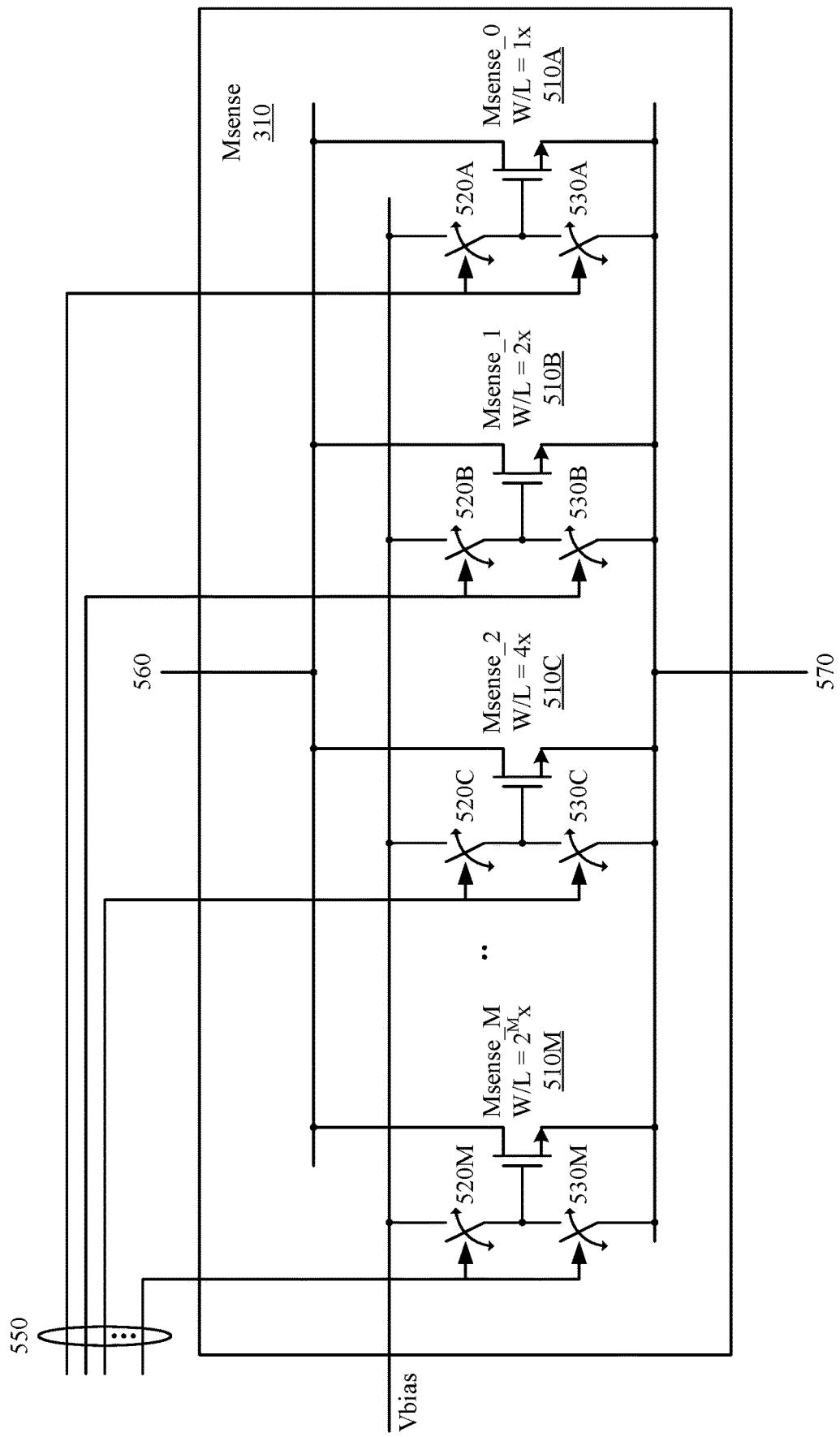
FIG. 5A is a circuit diagram illustrating a dynamic current sense circuit for the dynamic auto-ranging current sense circuit of FIG. 3, according to one embodiment.

FIG. 5A is a circuit diagram illustrating the sense transistor Msense 310 for the dynamic auto-ranging current sense circuit 300 of FIG. 3, according to one embodiment.

The sense transistor Msense 310 includes a set of transistors 510A through 510M (Msense_0 through Msense_M) connected in parallel. Each of the transistors 510A through 510M are connected between a first terminal 560 and a second terminal 570. The first terminal 560 is then connected to a first terminal of the main transistor Mp 220 and the second terminal 570 is connected to the sense amplifier 240 as shown in FIG. 3. The sense transistor Msense 310 further includes a set of bias switches 520A through 520M and a set of bypass switches 530A through 530M. At least each of a subset of the of the transistors 510 is connected to a first switch from the set of bias switches 520 and a second switch from the set of bypass switches 530. For instance, in the example of FIG. 5A, transistor 510B (Msense_1) is connected to a bias switch 520B and a bypass switch 530B. Similarly, transistor 510C (Msense_2) is connected to a switches 520C and 530C, and transistor 510M (Msense_M) is connected to a switches 520M and 530M.

In the example of FIG. 5A, each transistor 510 has a different size. For instance, each transistor 510 has a different channel width (W). In particular, in the example of FIG. 5A, the size of the transistors exponentially increases with a factor of 2. That is, the first transistor 510A (Msense_0) has a size of $W/L_0=2^0 x=1x$, the second transistor 510B (Msense_1) has a size of $W/L_1=2^1 x=2x$, the third transistor 510C (Msense_2) has a size of $W/L_2=2^2 x=4x$, and the mth transistor 510M (Msense_M) has a size of $W/L_M=2^M x$. In some embodiments, each transistor is made of multiple devices or multiple fingers having the same size. That is, each transistor 510 is made of one or more devices or fingers having the same W/L ratio. For instance, the first transistor 510A (Msense_0) is made of a single device having a 1x size, the second transistor 510B (Msense_1) is made of two devices having a 1x size connected in parallel, the third transistor 510C (Msense_2) is made of four devices having a 1x size connected in parallel, and the mth transistor 510M (Msense_M).

As such, the size of the sense transistor Msense 310 can be modified by dynamically activating or deactivating one or more transistors 510. For example, in the embodiments of FIG. 5A, by closing a first subset of bias switches 520, the transistors 510 corresponding to the closed bias switches 520 are activated. Moreover, by opening a second subset of bias switches 520, the transistors 510 corresponding to the opened bias switches 520 are deactivated. As such, the activated transistors are connected together, defining the size of the sense transistor Msense 310.

In some embodiments, the second set of bypass switches 530 are used to deactivate a subset of transistors 510. That is, by closing a bypass switch 530 form the set of bypass switches, the corresponding transistor 510 is deactivated by connecting the gate of the corresponding transistor 510 to the second terminal 570. In some embodiments the set of bias switches 520 and the set of bypass switches are controlled such that when a switch from the set of bias switches 520 is opened, the corresponding switch from the set of bypass switches 530 is closed. For example, when a switch 520J of the set of bias switches 520 corresponding to the jth transistor 510J is opened, the switch 530J of the set of bypass switches 530 corresponding to the jth transistor 510J is closed. Moreover, the set of bias switches 520 and the set of bypass switches are controlled such that when a switch from the set of bias switches 520 is closed, the corresponding switch from the set of bypass switches 530 is opened. For example, when a switch 520J of the set of bias switches 520 corresponding to the jth transistor 510J is closed, the switch 530J of the set of bypass switches 530 corresponding to the jth transistor 510J is opened switch.

In some embodiments, the switches 520 and 530 are made using transistors. That is, switches 520 and 530 are transistors that can be turned on to close a connection to the gate of a transistor 510 or turned off to open a connection to the gate of a transistor 510. In some embodiments, since switches 520 and 530 are not used to drive a current, the size of the transistor used to implement switches 520 and 530 are smaller than the size of transistors 510.

Each of the switches 520 and 530 is controlled by a sense control signal 550. In some embodiments the driver control signal 450 is the control signal Scontrol received from the controller 390. In one embodiment, the sense control signal 550 is generated using an encoder based on the control signal Scontrol received from the controller 390. FIG. 5D illustrates one implementation of an encoder used to generate the sense control signal 550.

Figure 5B:
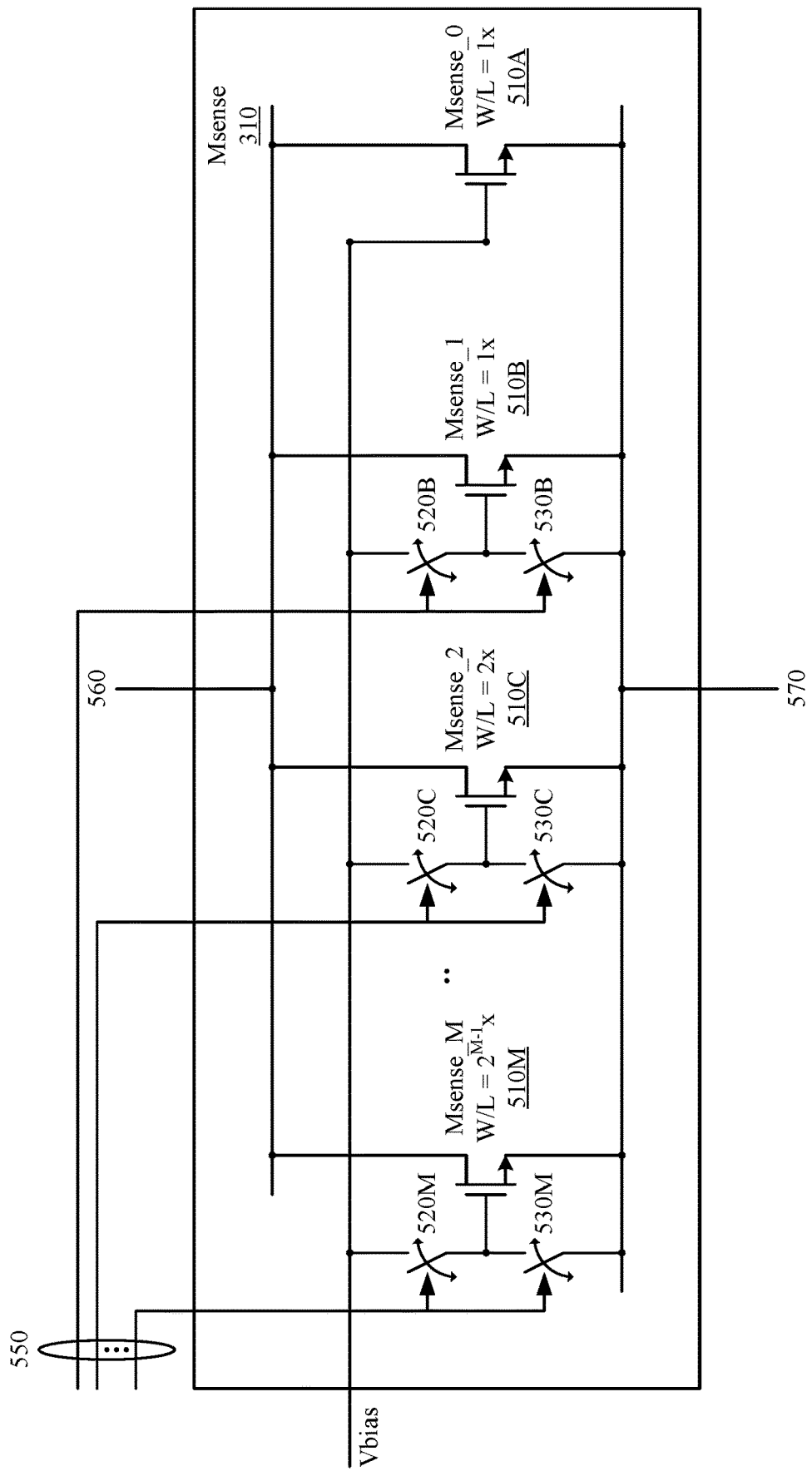
FIG. 5B is a circuit diagram illustrating a dynamic current sense circuit for the dynamic auto-ranging current sense circuit of FIG. 3, according to a second embodiment.

FIG. 5B is a circuit diagram illustrating the sense transistor Msense 310 for the dynamic auto-ranging current sense circuit 300 of FIG. 3, according to a second embodiment. In the embodiment of FIG. 5B, the first transistor 510A (Msense_0) does not have switches and is directly connected to Vbias. As such, the first transistor 510A cannot be deactivated. As such, the embodiment of FIG. 5B ensures that the minimum size of the sense transistor Msense 310 is the size of the first transistor 510A (Msense_0).

Figure 5C:
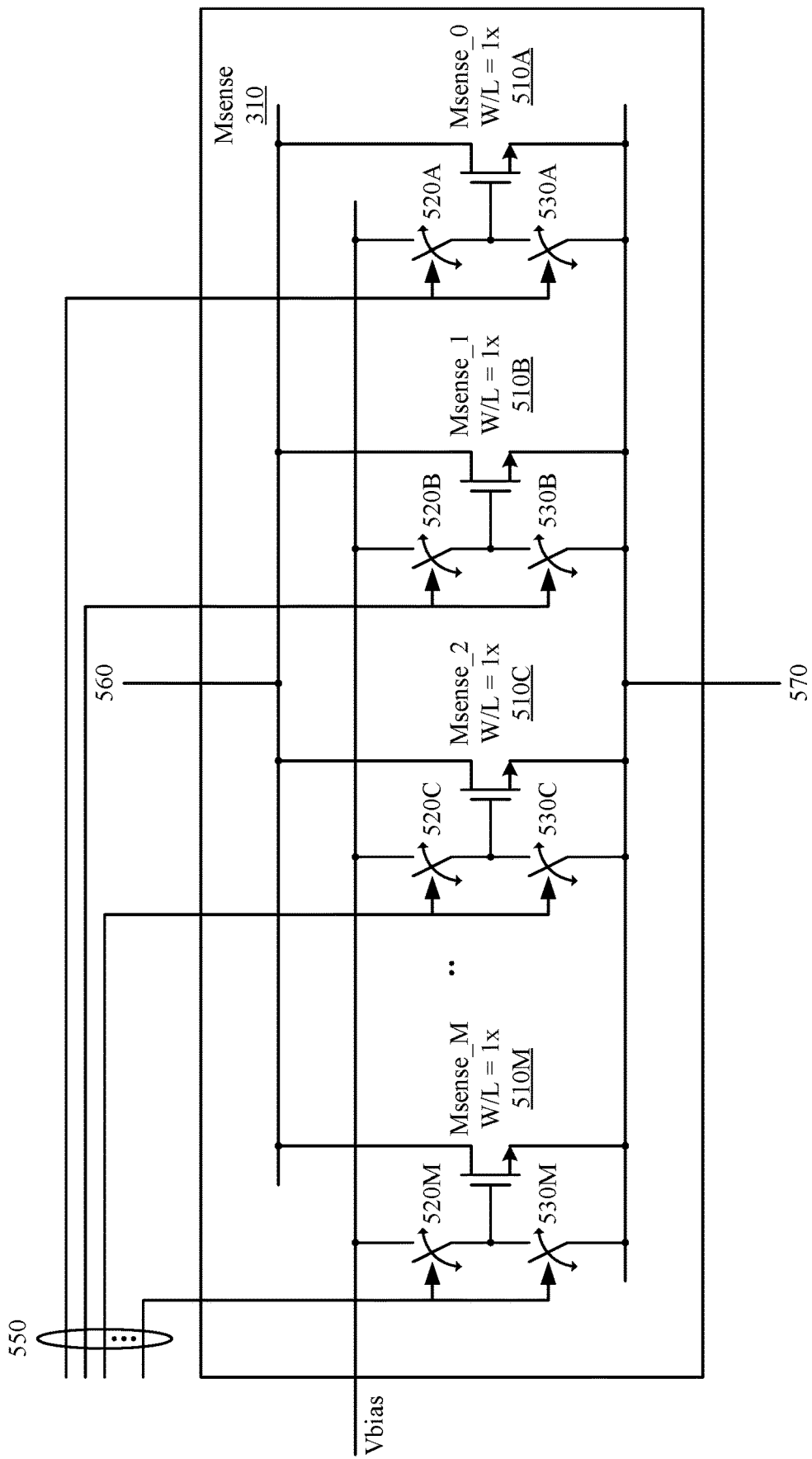
FIG. 5C is a circuit diagram illustrating a dynamic current sense circuit for the dynamic auto-ranging current sense circuit of FIG. 3, according to a third embodiment.
Figure 5D:
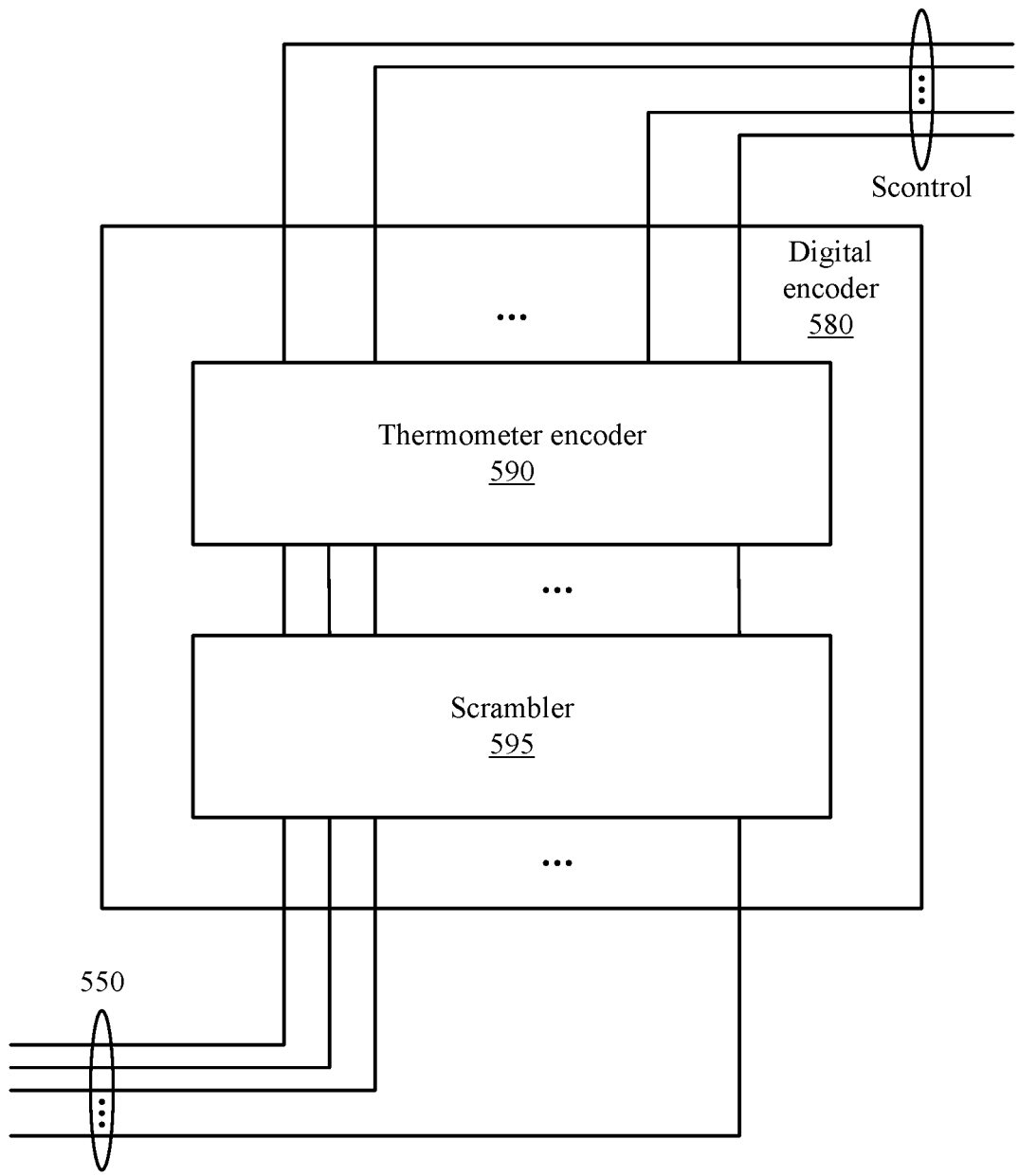
FIG. 5D is a circuit diagram illustrating a digital encoder to generate the sense control signal for controlling the dynamic current sense circuit, according to one embodiment.

FIG. 5C is a circuit diagram illustrating the sense transistor Msense 310 for the dynamic auto-ranging current sense circuit 300 of FIG. 3, according to a third embodiment. In the embodiment of FIG. 5C, every transistor 510 has the same size. In other embodiments, the sense transistor Msense 310 may include a first subset of transistors 510 having a first size, and a second subset of transistors 510 having a second size. In the example of FIG. 5C, the size of the sense transistor Msense 310 is controlled by the number of transistors 510 that are activated, and not based on which transistor 510 is activated. As such, the transistors that are activated to be used for the sense transistor Msense 310 can be rotated to account for transistor deterioration and process variation. That is, the transistors that are activated can be rotated to enable mismatches between different transistors to be distributed over time. Moreover, the activated transistors are rotated to sample different locations of the main transistor Mp 220 in terms of temperature, stress, and the like.

In some embodiments, to control which transistor 510 is used, a digital encoder having a scrambler is used. FIG. 5D is a circuit diagram illustrating a digital encoder 580 to generate the sense control signal 550 for controlling the sense transistor Msense 310, according to one embodiment. The digital encoder 580 may be part of the sense transistor Msense 310. Alternatively, the digital encoder 580 may be a separate module located in the signal path between the controller 390 and the sense transistor Msense 310. The digital encoder 580 receives, from the controller 390, the control signal Scontrol for controlling the sense transistor Msense 310, and generates the sense control signal 550. The digital encoder 580 may include, among other components, a thermometer encoder 590 and a scrambler 595.

The thermometer encoder 590 (or unary encoder) receives a binary number n as an input and generates an output having n bits have a first value. The binary number n is the control signal Scontrol received from the controller 390. In one embodiment, the thermometer encoder 590 receives a binary number n as an input and generates an output having n ones followed or preceded by zeros. In another embodiment, the thermometer encoder 590 receives a binary number n as an input and generates an output having n zeros followed or preceded by ones. For example, if the input has a value of 5 (i.e., 0101), the thermometer encoder 590 may generate an output having a value of 111110000000000 or 000000000011111. That is, an output having five 1s. In another embodiment, for an input value of 5 (i.e., 0101), the thermometer encoder 590 generates an output having a value of 111111111100000 or 000001111111111. That is, an output having five 0s.

The scrambler 595 receives the unary encoded number from the thermometer encoder 590 and randomizes (or pseud-randomizes) the position of the 1s or 0s. The scrambler 595 does not change the number of 1s or 0s from the unary encoded number. For example, if the unary encoded value generated by the thermometer encoder 590 is 111110000000000, the scrambler 595 may scramble the ones to generate the output signal 001010000100101.

The scrambled signal is then used to control the sense transistor Msense 310. That is, since the ones in the sense control signal 550 are scrambled, the digital encoder 580 randomizes which transistors 510 are being activated to achieve a desired size for the sense transistor Msense 310.

FIG. 5E is a plan view illustrating a layout of transistors 510 and the main transistor Mp 220, according to one embodiment. The main transistor Mp 220 includes multiple fingers, each having a size of 1x. In addition, each of the transistors 510A through 510M have a size of 1x and are interlaced within the set of fingers of the main transistor Mp 220. For instance, in the example of FIG. 5E, the main transistor Mp 220 includes multiple fingers grouped in arrays of ten fingers. The transistors 510A through 510M are placed in between two arrays of fingers of the main transistor Mp 220. For instance, the first sense transistor Msense_0 510A is between a first array of ten fingers and a second array of ten fingers that are part of the main transistor Mp 220. As such, if the fingers have mismatch due to process and temperature variations, and package stress and the properties of these fingers shift differently over time, this placement of the transistors 510A through 510M reduces the dependency of the dynamic auto-ranging current sense circuit 300 on those process variations.

Figure 6:
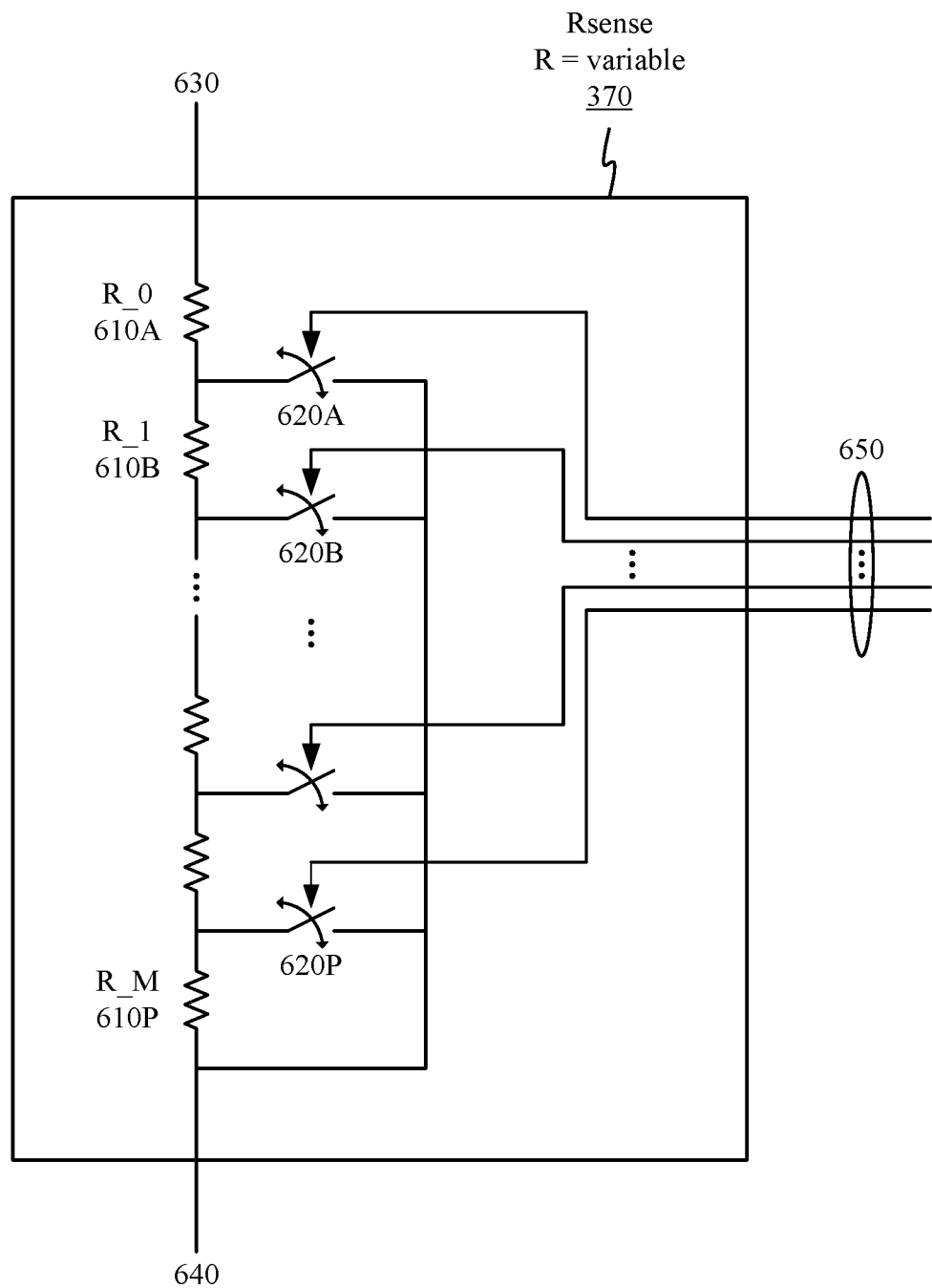
FIG. 6 is a circuit diagram illustrating a variable sense resistor for the dynamic auto-ranging current sense circuit of FIG. 3, according to one embodiment.

FIG. 6 is a circuit diagram illustrating the variable sense resistor 370 for the dynamic auto-ranging current sense circuit 300 of FIG. 3, according to one embodiment. The variable sense resistor 370 may include, among other components, a chain of resistors 610A through 620P connected in series between the first terminal 630 and the second terminal 640. The first terminal 630 may be coupled to the second terminal 570 of the sense transistor Msense 310 and the second terminal 640 may be coupled to ground or second supply voltage (Vss). Moreover, the variable sense resistor 370 includes multiple switches 620A through 620P. Each of the switches 620 is configured to bypass one or more resistors when closed. When one of the switches 620A through 620P is closed, one of the resistors 610 is connected to the second terminal 6740. For instance, if a jth switch is closed, the jth resistor is connected to the second terminal 6740, bypassing the (j+1)th to pth resistor.

Each of the switches 620 is controlled by a resistor control signal 650. In some embodiments the resistor control signal 650 is the control signal Rcontrol received from the controller 390. In one embodiment, the resistor control signal 650 is generated using an address decoder (not shown) based on the binary signal Rcontrol received from the controller 390.

Figure 7:
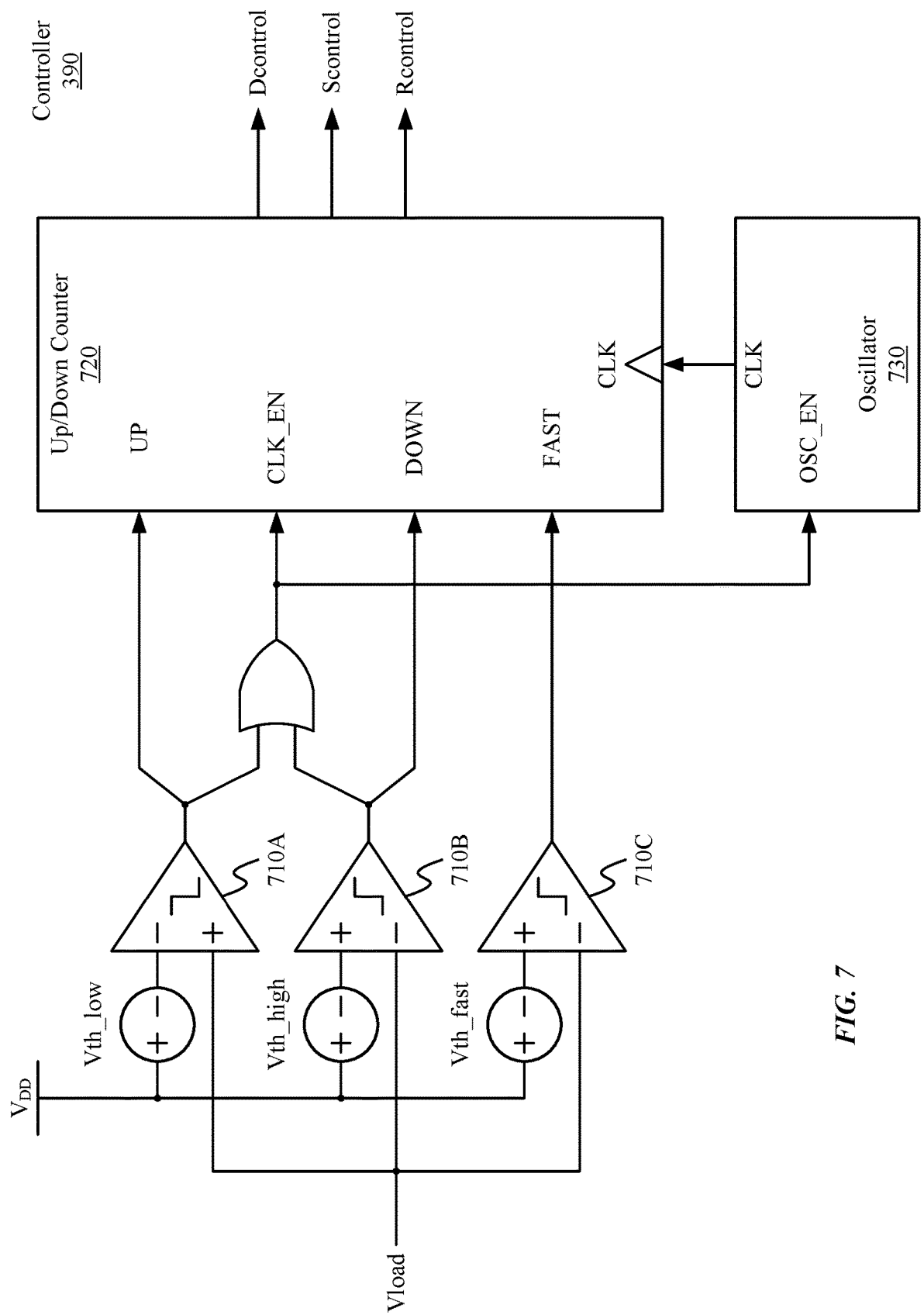
FIG. 7 is a circuit diagram illustrating a controller circuit for the dynamic auto-ranging current sense circuit of FIG. 3, according to one embodiment.

FIG. 7 is a circuit diagram illustrating the controller 390 for the dynamic auto-ranging current sense circuit 300 of FIG. 3, according to one embodiment. The controller 390 receives load voltage Vload from the main transistor Mp 220, and generates control signals Dcontrol, Scontrol, and Rcontrol for controlling the driver 330, sense transistor Msense 310, and the sense resistor Rsense 370. The controller 390 may include, among other components, multiple comparators 710, an up/down counter, and an oscillator.

Each comparator 710 compares the drain-to-source voltage (Vds) of the main transistor Mp 220 to a threshold voltage. For example, the first comparator 710A compares Vds to a first threshold voltage VTH_LOW, a second comparator 710B compares Vds to the second threshold voltage VTH_HIGH, and the third comparator 710C compares Vds to a third threshold voltage VTH_FAST. In some embodiments, each comparator 710 receives load voltage Vload and compares Vload to a threshold voltage. As used herein, the load voltage Vload is the voltage at the source terminal of the main transistor Mp, wherein Vds=Vd−Vload. For example, the first comparator 710A compares Vload to a first threshold voltage Vd−VTH_LOW, the second comparator 710B compares Vload to a second threshold voltage Vd−VTH_HIGH, and the third comparator 710C compares Vload to a third threshold voltage Vd−VTH_FAST, where Vd is the drain voltage of the main transistor Mp 220. In some embodiments, the drain voltage Vd of the main transistor Mp 220 is a supply voltage Vdd.

In another embodiment, each comparator 710 receives the drain voltage Vd of the main transistor Mp and the load voltage Vload and compares the difference between Vd and Vload to a threshold voltage.

When the drain-to-source voltage (Vds=Vd−Vload) of the main transistor Mp 220 is higher than VTH_LOW, the first comparator 710A outputs a signal having a first value (e.g., 0 or LO). Conversely, when Vds of the main transistor Mp 220 reaches or decreases below VTH_LOW, the first comparator 710A output a signal having a second value (e.g., 1 or HI). The output of the first comparator 710A is connected to the UP input of the up/down counter 720. When the up/down counter 720 receives a signal having the second value (e.g., 1 or HI) from the first comparator 710A, the up/down counter 720 increases the value of a stored count.

When Vds of the main transistor Mp 220 is lower than VTH_HIGH, the second comparator 710B outputs a signal having the first value (e.g., 0 or LO). Conversely, when Vds of the main transistor Mp 220 reaches or increases above VTH_HIGH, the second comparator 710B outputs a signal having the second value (e.g., 1 or HI). The output of the second comparator 710B is connected to the DOWN input of the up/down counter 720. When the up/down counter 720 receives a signal having the second value (e.g., 1 or HI) from the second comparator 710B, the up/down counter 720 decreases the value of a stored count.

In some embodiments, the polarity of the comparators 710 is reversed depending on the configuration of the up/down counter 720. For instance, if the up/down counter is configured to count up or down in response to a signal having the second value (e.g., 1 or HI), the polarity of the first comparator 710A or the second comparator 710B may be reversed.

Moreover, the outputs of the first comparator 710A and the second comparator 710B are used to generate a clock enabled signal CLK_EN to enable the up/down counter 720 and the oscillator 730. In some embodiments, the clock enabled signal CLK_EN is asserted when Vds of the main transistor Mp 220 is below VTH_LOW or above VTH_HIGH. That is, CLK_EN is asserted when Vds is outside of the voltage range <VTH_LOW, VTH_HIGH>.

When Vds of the main transistor Mp 220 is lower than VTH_FAST, the third comparator 710C outputs a signal having the first value (e.g., 0 or LO). Conversely, when Vds of the main transistor Mp 220 reaches or increases above VTH_FAST, the third comparator 710C output a signal having the second value (e.g., 1 or HI). When Vds if the main transistor Mp 220 exceeds VTH_FAST, the third comparator 710C sends a signal to the up/down counter 720 that causes the up/down counter to reset to an initial value. For instance, the up/down counter 720 may reset to a value of 0. This causes the control signals Dcontrol, Scontrol, and Rcontrol to rapidly change to the lowest configuration. That is, when Vds of the main transistor Mp 220 exceeds VTH_FAST, the gate voltage of the main transistor Mp 220 is reset to the maximum value, the current sense ratio of the sense transistor Msense 310 is reset to the maximum value, and the resistance of the sense resistor Rsense 370 is reset to the minimum value. In some embodiments, instead of resetting the up/down counter 720, the output of the third comparator 710C causes the count of the up/down counter 720 to decrease by a step larger than the count down step triggered by the second comparator 710B. That is, the output of the third comparator 710C causes the count of the up/down counter 720 to decrease by a step larger than one.

Example Process for Sensing Load Current

Figure 8A:
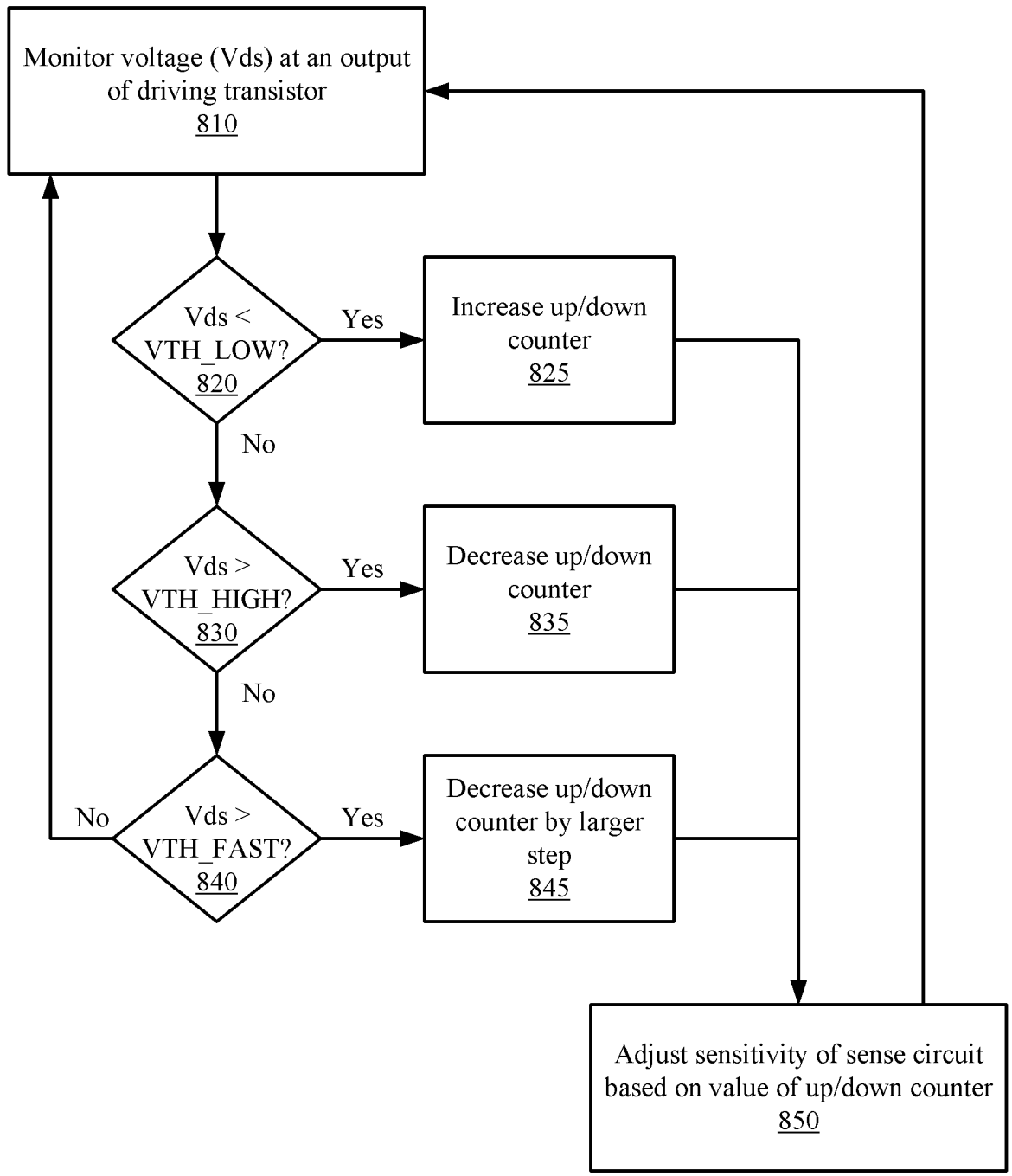
FIG. 8A is a flowchart illustrating a method for dynamically adjusting the sensitivity of the sense circuit, according to one embodiment.

FIG. 8A is a flowchart illustrating a method for dynamically adjusting the sensitivity of the dynamic auto-ranging current sense circuit 300, according to one embodiment. The method may include additional or fewer steps, and steps may be performed in different orders.

The controller 390, as described with reference to FIG. 3 and FIG. 7, monitors 810 the drain-to-source voltage (Vds) of the main transistor Mp 220. In some embodiments, the controller 390 monitors the drain-to-source voltage (Vds) of the main transistor Mp 220 by monitoring the load voltage (Vload) at an output of the main transistor Mp 220. The controller 390 then compares Vds to a set of threshold values. For instance, the first comparator 710A of the controller 390 compares 820 Vds to a first threshold voltage (VTH_LOW), the second comparator 710B of the controller 390 compares 830 Vds to a second threshold voltage (VTH_HIGH), and the third comparator 710C of the controller 390 compares 840 Vds to a third threshold voltage (VTH_FAST).

Based on the comparison, the controller circuit updates a value stored in the up/down counter 720. If Vds decreases below VTH_LOW, the controller 390 increases 825 the count stored in up/down counter 720. If Vds increases above VTH_HIGH, the controller 390 decreases 835 the count stored in the up/down counter 720. If Vds exceeds VTH_FAST, the controller 390 decreases 845 the count stored in the up/down counter 720 by an amount larger than 1. In some embodiments, if Vds exceeds VTH_FAST, the controller 390 resets the up/down counter 720.

In some embodiments, if Vds is either below VTH_LOW or above VTH_HIGH, the controller 390 turns on oscillator 730 to generate a clock signal CLK to control the rate at which the up/down counter 720 counts up or down. That is, as long as Vds stays below VTH_LOW, the controller 390 decreases the count in response to each clock pulse generated by the oscillator 730 until Vds increases above VTH_LOW. Conversely, as long as Vds stays above VTH_HIGH, the controller 390 increases the count in response to each clock pulse generated by the oscillator 730 until Vds decreases below VTH_HIGH.

Based on the value of the up/down counter 720, the sensitivity of the dynamic auto-ranging current sense circuit 300 is adjusted 850. That is, based on the value of the up/down counter 720, the driver 330, the sense transistor Msense 310, and the resistor 370 are controlled.

Figure 8C:
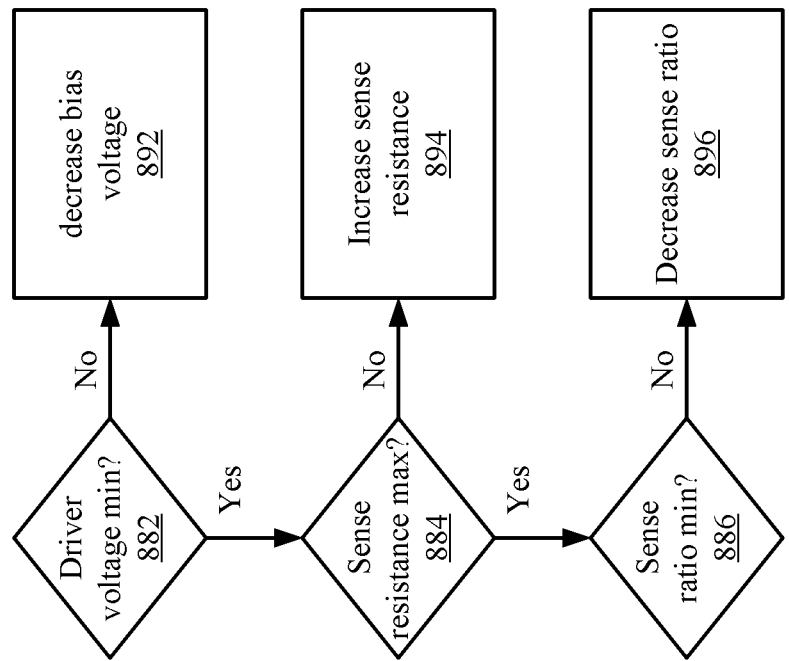
FIG. 8C is a flowchart illustrating a process for adjusting the sensitivity of the sense circuit when the count of the up/down counter decreases, according to one embodiment.
Figure 8B:
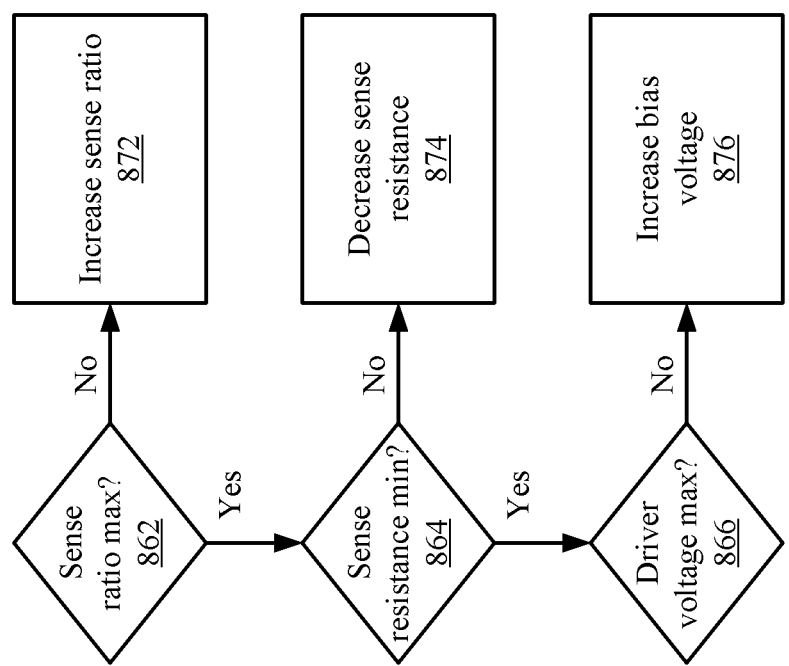
FIG. 8B is a flowchart illustrating a process for adjusting the sensitivity of the sense circuit when the count of the up/down counter increases, according to one embodiment.

FIG. 8B is a flowchart illustrating a process for adjusting the sensitivity of the sense circuit when the count of the up/down counter decreases, according to one embodiment. That is, FIG. 8 illustrates a process for adjusting the sensitivity of the sense circuit as the amplitude of the load current increases. In the embodiment of FIG. 8B, as the load current increases first the sense ratio between the main transistor Mp 220 and the sense transistor Msense 310 is increased. That is, the sense transistor Msense 310 is controlled to decrease the size of the sense transistor Msense 310 (e.g., by reducing the number of transistors that are active in the sense transistor Msense 310). Then, when the sense ratio reaches the maximum value, the resistance value of the sense resistor Rsense 370 is decreased. Finally, when the resistance value of the sense resistor Rsense 370 reaches the minimum value, the bias voltage Vbias provided by the driver 330 is increased. That is, the driver 330 is controlled to increase the number of diode connected transistors that are active.

For instance, the controller 390 determines 862 whether the sense ratio between the main transistor Mp 220 and the sense transistor Msense 310 is at a maximum value. If the sense ratio between the main transistor Mp 220 and the sense transistor Msense 310 is not at a maximum value, the sense ratio between the main transistor Mp 220 and the sense transistor Msense 310 is increased 872. Otherwise, if the sense ratio between the main transistor Mp 220 and the sense transistor Msense 310 is at a maximum value, the controller 390 determines 864 whether the resistance of the sense resistor Rsense 370 is at a minimum value. If the resistance of the sense resistor Rsense 370 is not at a minimum value, the resistance of the sense resistor Rsense 370 is decreased 874. Otherwise, if the resistance of the sense resistor Rsense 370 is at a minimum value, the controller 390 determines whether the bias voltage Vbias provided by the driver 330 is at a maximum value. If the bias voltage Vbias is not at a maximum value, the bias voltage Vbias is increased 876.

FIG. 8C is a flowchart illustrating a process for adjusting the sensitivity of the sense circuit when the count of the up/down counter increases, according to one embodiment. That is, FIG. 8 illustrates a process for adjusting the sensitivity of the sense circuit as the amplitude of the load current decreases. In the embodiment of FIG. 8C, as the load current decreases first the bias voltage Vbias is decreased. Then, when the bias voltage Vbias reaches the minimum value, the resistance of the sense resistor Rsense 370 is increased. Finally, when the resistance of the sense resistor Rsense 370 reaches the maximum value, the sense ratio between the main transistor Mp 220 and the sense transistor Msense 310 is decreased.

For instance, the controller 390 determines 882 whether the bias voltage Vbias provided by the driver 330 is at a minimum value. If the bias voltage Vbias is not at a minimum value, the bias voltage Vbias is decreased 892. Otherwise, if the bias voltage Vbias is at a minimum value, the controller 390 determines 884 whether the resistance of the sense resistor Rsense is at a maximum value. If the resistance of the sense resistor Rsense is not at a maximum value, the resistance of the sense resistor Rsense is increased 894. Otherwise, if the resistance of the sense resistor Rsense is at a maximum value, the controller determines 886 whether the sense ratio between the main transistor Mp 220 and the sense transistor Msense 310 is at a minimum value. If the sense ratio between the main transistor Mp 220 and the sense transistor Msense 310 is not at a minimum value, the sense ratio between the main transistor Mp 220 and the sense transistor Msense 310 is decreased 896.

In other embodiments, the order in which the sense ratio, the bias voltage Vbias and the resistance of the sense resistor Rsense are adjusted may be different from what is shown in FIGS. 8A and 8B.

Since the up/down discrete steps are changed in response to a load current range based on the voltage at the output of the driving transistor Mp 220, the sense current ratio and the sense resistor scale factor can be controlled and are known. Therefore, a low-resolution ADC can be used while maintaining the dynamic range of the dynamic auto-ranging current sense circuit 300.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A current sensing circuit comprising:
    a sense transistor configured to generate sensing current, the sense transistor coupled to a main transistor that provides a load current, the sense transistor comprising a plurality of individual devices which are selectively activated to adjust a gain ratio between the load current and the sensing current;
    a driver having an output terminal coupled to the sense transistor to control a bias voltage provided to the sense transistor and the main transistor to control the load current;
    a sense resistor coupled to the sense transistor, a resistance of the sense resistor adaptively controlled based on the load current; and
    a controller circuit configured to, based on the load current, modify a resistance of the main transistor by adjusting the bias voltage, and at least one of:
        a gain ratio between the load current and the sensing current by adjusting the individual devices activated, and
        the resistance of the sense resistor.

2. The current sensing circuit of claim 1, wherein the driver comprises:
    a current source configured to provide a bias current;
    a first driver device coupled to the current source and configured to receive the bias current;
    a second driver device coupled to the first driver device and configured to receive at least part of the bias current; and
    a first switch configured to turn on or off the second driver device to control the bias voltage according to a control signal received from the controller circuit.

3. The current sensing circuit of claim 2, wherein the first driver device and the second driver device are connected in series.

4. The current sensing circuit of claim 1, wherein the plurality of individual devices comprise:
    a first sensing device having a gate connected to a first bias switch and a first bypass switch; and
    a second sensing device having a gate connected to a second bias switch and a second bypass switch;
    wherein a gain ratio between the load current and sensing current is adjusted by controlling a number of bias switches that are in a closed position.

5. The current sensing circuit of claim 4, wherein the gain ratio between the load current and sensing current is increased by decreasing a number of bias switches that are in the closed position.

6. The current sensing circuit of claim 4, wherein the gain ratio between the load current and sensing current is increased by decreasing the number of bypass switches that are in an open position.

7. The current sensing circuit of claim 4, wherein a size of the first sensing device is equal to a size of the second sensing device.

8. The current sensing circuit of claim 4, wherein a size of the second sensing device is double a size of the first sensing device.

9. The current sensing circuit of claim 1, wherein the individual devices of the sense transistor are interlaced between arrays of fingers of the main transistor.

10. The current sensing circuit of claim 1, further comprising:
    a digital encoder configured receive a sense transistor control signal for controlling a gain ratio between the load current and sensing current, and configured to generate signals for activating a subset of the plurality of individual devices, the digital encoder comprising:
        a thermometer encoder configured to encode the sense transistor control signal in a unary encoding, and
        a scrambler configured to scramble the unary encoded signal.

11. The current sensing circuit of claim 1, wherein the controller circuit comprises:
    a first comparator configured to generate a first counter signal responsive to a load voltage of the main transistor becoming lower than a first threshold voltage;
    a second comparator configured to generate a second counter signal responsive to the load voltage of the main transistor becoming greater than a second threshold voltage; and
    a counter configured to decrease a count responsive to receiving the first counter signal and configured to increase the count responsive receiving the second counter signal,
    wherein a gain ratio between the load current and the sensing current, and the resistance of the sense resistor are adjusted based on the count of the counter.

12. The current sensing circuit of claim 11, wherein the controller circuit further comprises:
    a third comparator configured to generate a third counter signal responsive to the load voltage becoming greater than a third threshold voltage, the third counter signal causing the counter to reset responsive to the counter receiving the third counter signal.

13. A method for sensing a load current, comprising:
    generating, by a sense transistor, a sensing current, the sense transistor coupled to a main transistor that provides the load current, the sense transistor comprising a plurality of individual devices which are selectively activated to adjust a gain ratio between the load current and the sensing current;
    providing, by a driver, a bias voltage to the sense transistor and the main transistor to control the load current;
    generating, by a sense resistor, a sense voltage, a resistance of the sense resistor adaptively controlled based on the load current;
    monitoring a voltage at an output of the main transistor; and based on the monitored voltage at the output of the main transistor, modifying a resistance of the main transistor by adjusting the bias voltage, and at least one of:
- a gain ratio between the load current and the sensing current by adjusting the individual devices activated, and
- the resistance of a sense resistor.

14. The method of claim 13, wherein adjusting the bias voltage comprises:
adjusting a number of transistor that are active in the driver.

15. The method of claim 13, wherein the driver comprises a current source configured to provide a bias current, a first driver device coupled to the current source and configured to receive the bias current, a second driver device coupled to the first driver device and configured to receive at least part of the bias current, and a first switch configured to turn on or off the second driver device to control the bias voltage according to a control signal received from the controller circuit, and wherein adjusting a gate voltage of the main transistor comprises opening the first switch to increase the gate voltage of the main transistor.

16. The method of claim 13, wherein the plurality of individual devices comprise a first sensing device having a gate connected to a first bias switch and a first bypass switch, and a second sensing device having a gate connected to a second bias switch and a second bypass switch, and wherein modifying a gain ratio between the load current and the sensing current comprises controlling a number of bias switches that are in a closed position.

17. The method of claim 16, wherein the gain ratio between the load current and the sensing current is increased by decreasing the number of bias switches that are in the closed position.

18. The method of claim 16, wherein the gain ratio between the load current and the sensing current is increased by decreasing the number of bypass switches that are in an open position.

19. The method of claim 13, wherein monitoring a voltage at an output of a main transistor comprises:
- responsive to the voltage at the output of the main transistor being lower than a first threshold voltage, decreasing a count of a counter; and
- responsive to the voltage at the output of the main transistor being greater than a second threshold voltage, increasing the count of a counter.

20. An electronic device comprising:
a current sensing circuit comprising:
- a sense transistor configured to generate sensing current, the sense transistor coupled to a main transistor that provides a load current, the sense transistor comprising a plurality of individual devices which are selectively activated to adjust a gain ratio between the load current and the sensing current;
- a driver having an output terminal coupled to the sense transistor to control a bias voltage provided to the sense transistor and the main transistor to control the load current;
- a sense resistor coupled to the sense transistor, a resistance of the sense resistor adaptively controlled based on the load current; and
- a controller circuit configured to, based on the load current, modify a resistance of the main transistor by adjusting the bias voltage, and at least one of:
  - a gain ratio between the load current and the sensing current by adjusting the individual devices activated, and
  - the resistance of the sense resistor.

* * * * *